US009297694B2

(12) United States Patent
Nomura

(10) Patent No.: US 9,297,694 B2
(45) Date of Patent: Mar. 29, 2016

(54) CORRECTION DEVICE AND CORRECTION METHOD FOR LIGHT RECEPTION POWER MONITOR

(71) Applicant: NEC CORPORATION, Tokyo (JP)

(72) Inventor: Rintaro Nomura, Tokyo (JP)

(73) Assignee: NEC CORPORATION, Tokyo (JP)

( * ) Notice: Subject to any disclaimer, the term of this patent is extended or adjusted under 35 U.S.C. 154(b) by 0 days.

(21) Appl. No.: 14/414,718

(22) PCT Filed: Aug. 1, 2013

(86) PCT No.: PCT/JP2013/070883
§ 371 (c)(1),
(2) Date: Jan. 14, 2015

(87) PCT Pub. No.: WO2014/027574
PCT Pub. Date: Feb. 20, 2014

(65) Prior Publication Data
US 2015/0168211 A1    Jun. 18, 2015

(30) Foreign Application Priority Data

Aug. 16, 2012  (JP) ................................. 2012-180414

(51) Int. Cl.
*G01J 1/18* (2006.01)
*H04B 10/69* (2013.01)
(Continued)

(52) U.S. Cl.
CPC .... *G01J 1/18* (2013.01); *G01J 1/44* (2013.01); *H03M 1/1038* (2013.01); *H04B 10/69* (2013.01); *G01J 2001/186* (2013.01); *G01J 2001/444* (2013.01); *G01J 2001/4466* (2013.01)

(58) Field of Classification Search
CPC .............................. G01J 1/18; G01J 2001/186
USPC ............ 250/214 R, 214 C, 214 DC, 214 AG; 398/136, 158, 208
See application file for complete search history.

(56) References Cited

U.S. PATENT DOCUMENTS 7,508,329 B1    3/2009  Chambers
2006/0043266 A1*  3/2006  Nakamoto .............. H03F 3/087
250/214 R (Continued)

FOREIGN PATENT DOCUMENTS

JP          54-118761 A    9/1979
JP        2005-249473 A    9/2005

(Continued)

OTHER PUBLICATIONS

International Search Report for PCT/JP2013/070883 dated Oct. 8, 2013.

(Continued)

*Primary Examiner* — Kevin Pyo
(74) *Attorney, Agent, or Firm* — Sughrue Mion, PLLC

(57) ABSTRACT

The objective of the present invention is to quickly and precisely correct the measured value for light reception power to the actual value with few resources, by installing a correction device for a light reception power monitor for signal light in an optical module. The correction device is equipped with a correction table which is referenced when correcting the measured value for the light reception power of signal light, and in this correction table multiple correction values are stored in advance on the basis of the correspondence relationships between multiple reference values and multiple actual values. In the correction table, for segments wherein the change in the actual values with respect to the change in the measured values is small, the interval between the reference values is made smaller and more correction values are stored than for segments wherein the change in the actual values with respect to the change in the measured values is large. When an input value indicating the measured value for the light reception power of the signal light matches a reference value in the correction table, the correction device reads from the correction table the correction value corresponding to the reference value. When an input value does not match a reference value in the correction table, the correction device calculates a correction value in accordance with a prescribed calculation formula on the basis of the input value.

8 Claims, 15 Drawing Sheets

(51) Int. Cl.
*H03M 1/10* (2006.01)
*G01J 1/44* (2006.01)

(56) References Cited

U.S. PATENT DOCUMENTS

| | | |
|---|---|---|
| 2007/0127035 A1 | 6/2007 | Demarest |
| 2011/0243572 A1* | 10/2011 | Tanaka ................ H04B 10/672 398/141 |
| 2014/0361151 A1* | 12/2014 | Nomura ................ H03F 3/087 250/214 R |

FOREIGN PATENT DOCUMENTS

| | | |
|---|---|---|
| JP | 2009-33568 A | 2/2009 |
| JP | 2009-517693 A | 4/2009 |
| JP | 2009-165129 A | 7/2009 |
| JP | 2010-212900 A | 9/2010 |

OTHER PUBLICATIONS

"Diagnostic Monitoring Interface for Optical Transceivers", SFF Committee, SFF-8472, Jun. 11, 2013, Rev 11.3, 41 pages.

* cited by examiner

Fig.4

| ELEMENT NUMBER | ADC MEASURED VALUE (Mk) | CORRECTION VALUE (Gkx) | |
|---|---|---|---|
| 1 | 1 | $G_1$ | |
| ⋮ | ⋮ | ⋮ | REGION 1 |
| k(=1~16) | k1 | $G_{k1}$ | |
| ⋮ | ⋮ | ⋮ | |
| 16 | 16 | $G_{16}$ | |
| 17 | 20 | $G_{20}$ | |
| ⋮ | ⋮ | ⋮ | REGION 2 |
| k(=17~32) | k2=4×(k−16)+16 | $G_{k2}$ | |
| ⋮ | ⋮ | ⋮ | |
| 32 | 80 | $G_{80}$ | |
| 33 | 96 | $G_{96}$ | |
| ⋮ | ⋮ | ⋮ | REGION 3 |
| k(=33~48) | k3=16×(k−32)+80 | $G_{k3}$ | |
| ⋮ | ⋮ | ⋮ | |
| 48 | 336 | $G_{336}$ | |
| 49 | 576 | $G_{576}$ | |
| ⋮ | ⋮ | ⋮ | REGION 4 |
| k(=49~64) | k4=240×(k−48)+336 | $G_{k4}$ | |
| ⋮ | ⋮ | ⋮ | |
| 64 | 4176 | $G_{4176}$ | |

Fig.8

| ELEMENT NUMBER | ADC MEASURED VALUE (Mk) | CORRECTION VALUE (Gk) |
|---|---|---|
| 1 | 1 | $G_1$ |
| 2 | 65 | $G_2$ |
| 3 | 129 | $G_3$ |
| ⋮ | ⋮ | ⋮ |
| k | 64×(k−1)+1 | $G_k$ |
| ⋮ | ⋮ | ⋮ |
| 63 | 3869 | $G_{63}$ |
| 64 | 4033 | $G_{64}$ |

| ELEMENT NUMBER | CALCULATION INFORMATION FOR CALCULATING CORRECTION VALUE IN ACCORDANCE WITH NONLINEAR CALCULATION FORMULA |
|---|---|
| 1 | $G_{1\_2} = A_{1\_2} \times (ad)^4 + B_{1\_2} \times (ad)^3 + C_{1\_2} \times (ad)^2 + D_{1\_2} \times (ad) + E_{1\_2}$ |
| 2 | $G_{2\_3} = A_{2\_3} \times (ad)^4 + B_{2\_3} \times (ad)^3 + C_{2\_3} \times (ad)^2 + D_{2\_3} \times (ad) + E_{2\_3}$ |
| 3 | $G_{3\_4} = A_{3\_4} \times (ad)^4 + B_{3\_4} \times (ad)^3 + C_{3\_4} \times (ad)^2 + D_{3\_4} \times (ad) + E_{3\_4}$ |
| ⋮ | ⋮ |
| k | $G_{k\_k+1} = A_{k\_k+1} \times (ad)^4 + B_{k\_k+1} \times (ad)^3 + C_{k\_k+1} \times (ad)^2 + D_{k\_k+1} \times (ad) + E_{k\_k+1}$ |
| ⋮ | ⋮ |
| 63 | $G_{63\_64} = A_{63\_64} \times (ad)^4 + B_{63\_64} \times (ad)^3 + C_{63\_64} \times (ad)^2 + D_{63\_64} \times (ad) + E_{63\_64}$ |
| 64 | $G_{64\_E} = A_{64\_E} \times (ad)^4 + B_{64\_E} \times (ad)^3 + C_{64\_E} \times (ad)^2 + D_{64\_E} \times (ad) + E_{64\_E}$ |

| ELEMENT NUMBER | ADC MEASURED VALUE (Mk) | CORRECTION VALUE (Gkx) | |
|---|---|---|---|
| 1 | 1 | $G_1$ | REGION 1 |
| ⋮ | ⋮ | ⋮ | |
| k(=1~16) | k1 | $G_{k1}$ | |
| ⋮ | ⋮ | ⋮ | |
| 16 | 16 | $G_{16}$ | |
| 17 | 20 | $G_{20}$ | REGION 2 |
| ⋮ | ⋮ | ⋮ | |
| k(=17~32) | k2=4×(k−16)+16 | $G_{k2}$ | |
| ⋮ | ⋮ | ⋮ | |
| 32 | 80 | $G_{80}$ | |
| 33 | 96 | $G_{96}$ | REGION 3 |
| ⋮ | ⋮ | ⋮ | |
| k(=33~48) | k3=16×(k−32)+80 | $G_{k3}$ | |
| ⋮ | ⋮ | ⋮ | |
| 48 | 336 | $G_{336}$ | |
| 49 | 576 | $G_{576}$ | REGION 4 |
| ⋮ | ⋮ | ⋮ | |
| k(=49~64) | k4=240×(k−48)+336 | $G_{k4}$ | |
| ⋮ | ⋮ | ⋮ | |
| 64 | 4176 | $G_{4176}$ | |

CALCULATION INFORMATION FOR CALCULATING CORRECTION VALUE IN ACCORDANCE WITH NONLINEAR CALCULATION FORMULA

| ELEMENT NUMBER | CALCULATION INFORMATION FOR CALCULATING CORRECTION VALUE IN ACCORDANCE WITH NONLINEAR CALCULATION FORMULA |
|---|---|
| 1 | $G_{1,2} = A_{1,2} \times (ad-M_1)^4 + B_{1,2} \times (ad-M_1)^3 + C_{1,2} \times (ad-M_1)^2 + D_{1,2} \times (ad-M_1) + E_{1,2}$ |
| 2 | $G_{2,3} = A_{2,3} \times (ad-M_2)^4 + B_{2,3} \times (ad-M_2)^3 + C_{2,3} \times (ad-M_2)^2 + D_{2,3} \times (ad-M_2) + E_{2,3}$ |
| 3 | $G_{3,4} = A_{3,4} \times (ad-M_3)^4 + B_{3,4} \times (ad-M_3)^3 + C_{3,4} \times (ad-M_3)^2 + D_{3,4} \times (ad-M_3) + E_{3,4}$ |
| ... | ... |
| k | $G_{k,k+1} = A_{k,k+1} \times (ad-M_k)^4 + B_{k,k+1} \times (ad-M_k)^3 + C_{k,k+1} \times (ad-M_k)^2 + D_{k,k+1} \times (ad-M_k) + E_{k,k+1}$ |
| ... | ... |
| 63 | $G_{3936\_4176} = A_{63,64} \times (ad-M_{63})^4 + B_{63,64} \times (ad-M_{63})^3 + C_{63,64} \times (ad-M_{63})^2 + D_{63,64} \times (ad-M_{63}) + E_{63,64}$ |
| 64 | $G_{4176\_E} = A_{64\_E} \times (ad-M_{64})^4 + B_{64\_E} \times (ad-M_{64})^3 + C_{64\_E} \times (ad-M_{64})^2 + D_{64\_E} \times (ad-M_{64}) + E_{64\_E}$ |

CORRECTION DEVICE AND CORRECTION METHOD FOR LIGHT RECEPTION POWER MONITOR

CROSS REFERENCE TO RELATED APPLICATIONS

This application is a National Stage of International Application No. PCT/JP2013/070883 filed Aug. 1, 2013, claiming priority based on Japanese Patent Application No. 2012-180414 filed Aug. 16, 2012, the contents of all of which are incorporated herein by reference in their entirety.

TECHNICAL FIELD

The present invention relates to a device and a method for correcting a measured value of a light reception power monitor in an optical module having a light reception function using an APD (Avalanche Photodiode).

This application is based upon and claims the benefit of priority from Japanese Patent Application No. 2012-180414, filed on Aug.16, 2012, the content of which is incorporated herein by reference.

BACKGROUND ART

Conventionally, a technique relating to a light reception power monitor of an optical module has been developed and disclosed in various pieces of literature. Patent Literature 1 discloses a light power meter for correcting light reception sensitivity using a correction coefficient in order to precisely measure light power of measured light even when light reception sensitivity of a light receiving element deteriorates over time. Patent literature 2 discloses an optical LAN system adapted to control a light output signal of an optical reception/transmission module on the basis of a value of a light reception power monitor. Patent literature 3 discloses a light reception power monitor circuit that has improved precision by correcting offset caused by dark current or leak current of an electric circuit. Patent Literature 4 discloses a technique for compensating for a difference and uncertainty in data age between a plurality of measurements by an electron avalanche photodiode (APD) in measuring changes in position, length, distance, or optical length using an interferometer.

The SFF Committee (Small Form Factor Committee) has created SFF-8472 specification for diagnostic monitoring interface for optical transceivers (see Non-Patent Literature 1). When a measured value of a light reception power monitor in an optical module is corrected by the specification, an MPU (Microprocessing Unit) inputs the measured value in a calculation formula for linear interpolation, fourth-order curve interpolation, or the like, to calculate a correction value. In the SFF-8472 specification, on the basis of a measured value of a light reception power monitor, a calculation formula for a fourth-order interpolation is executed to calculate an actual value (hereinafter referred to as correction value) of light reception power.

$$\text{Actual value} = A \times ADC\ \text{value}^4 + B \times ADC\ \text{value}^3 + C \times ADC\ \text{value}^2 + D \times ADC\ \text{value} + E$$

In the above calculation formula, "ADC value" represents a measured value obtained by converting an analog value obtained by converting received light into an electric signal using a photodiode into a digital value by an A/D converter. In addition, A, B, C, D, and E represent constant values for correction.

In general, in order to achieve miniaturization, low power consumption, and low cost in an optical module, installation of an inexpensive and low-speed MPU is desirable. However, the use of such an MPU makes it difficult to calculate an actual value on the basis of a measured value of a light reception power monitor by executing high load processing such as a fourth-order interpolation in a short time.

When correcting a measured value of the light reception power monitor by the inexpensive and low-speed MPU without any fourth-order interpolation calculation, an actual value corresponding to the measured value can be acquired by causing the MPU to create in advance a table storing a relationship between measured value and actual value and to refer to the table.

Patent Literature 3 and Patent literature 4 describe the above conventional techniques. Patent Literature 3 discloses a structural example of a light reception power monitor, and Patent Literature 4 discloses a technique for referring to a lookup table to compensate for APD characteristics.

CITATION LIST

Patent Literature

[PTL 1]
Japanese Unexamined Patent Application Publication No. 2005-249473
[PTL 2]
Japanese Unexamined Patent Application Publication No. 2009-033568
[PTL 3]
Japanese Unexamined Patent Application Publication No. 2010-212900
[PTL 4]
Japanese Unexamined Patent Application Publication (Translation of PCT Application) No. 2009-517693

Non Patent Literature

[NPL 1]
SFF Committee, URL: "ftp://ftp.seagate.com/sff/SFF-8472.PDF"; "SFF-8472 Rev. 11. 3"

SUMMARY OF INVENTION

Technical Problem

However, when a range of the measured value of the light reception power monitor is large, the number of actual values (i.e. correction values) corresponding to measured values increases, thus increasing the size of the table describing the relationship between measured value and actual value and leading to increased memory usage.

The present invention has been accomplished in view of the above circumstances, and it is an objective of the invention to provide a correction device and a correction method for a light reception power monitor in an optical module, which allow reduction in the size of a measured value correction table of the light reception power monitor and allow high-precision acquisition of a correction value corresponding to a measured value.

Solution to Problem

The present invention relates to a correction device for a light reception power monitor of an optical module. The correction device includes a storage unit storing a correction table that is referred to when correcting a measured value of light reception power of signal light and stores a plurality of correction values in advance on the basis of a correlation between a plurality of reference values and a plurality of actual values; and a signal processing unit reading, when an input value indicating the measured value of the light reception power of the signal light matches a reference value in the correction table, a correction value correlated with the reference value from the correction table, and calculating, when the input value does not match any reference values in the correction table, a correction value in accordance with a predetermined calculation formula on the basis of the input value. In addition, the plurality of correction values are stored in the correction table in such a manner that an interval between the plurality of reference values is smaller for a segment in which a change in the actual values is small relative to a change in the reference values than for a segment in which the change in the actual values is large relative to the change in the reference values.

The present invention relates to a correction method for a light reception monitor of an optical module. The correction method includes: storing, in a correction table that is referred to when correcting a measured value of light reception power of signal light and stores a plurality of correction values on the basis of a correlation between a plurality of reference values and a plurality of actual values, the plurality of correction values in such a manner that an interval between the plurality of reference values is smaller for a segment in which a change in the actual values is small relative to a change in the reference values than for a segment in which the change in the actual values is large relative to the change in the reference values; and when an input value indicating the measured value of the light reception power of the signal light matches a reference value in the correction table, reading a correction value correlated with the reference value from the correction table, and when the input value does not match any reference values in the correction table, calculating a correction value in accordance with a predetermined calculation formula on the basis of the input value.

The present invention relates to a program incorporating a correction method for a light reception power monitor of an optical module.

Advantageous Effect of Invention

In the correction device and the correction method according to aspects of the present invention, in the correction table storing the plurality of reference values and the plurality of correction values by correlating the values with each other, the number of the reference values is reduced as compared to the number of digital input values indicating measured values of light reception power of signal light, each represented by a number of bits, so that storage capacity of the correction table can be reduced. Additionally, the use of a nonlinear calculation formula set for each of the ranges of the reference values to which the input values belong allows calculation of a correction value even for an input value that does not match any of the reference values stored in the correction table. Furthermore, the plurality of correction values are stored in the correction table in such a manner that the interval between the reference values is smaller for a segment in which the change in the actual values is small relative to the change in the reference values than for a segment in which the change in the actual values is large relative to the change in the reference values. This causes the correction values to be finely set in a high-order curve interpolation showing a smaller change rate in the reference values than a linear interpolation showing a large change rate in the reference values, thus allowing a correction value corresponding to an input value to be calculated with high precision.

BRIEF DESCRIPTION OF DRAWINGS

FIG. 4 is a table depicting a storage content of a correction table stored in a memory of the optical module;

FIG. 8 is a table depicting a storage content of a correction table stored in a memory of the optical module;

FIG. 9 is a table depicting a storage content of a calculation information table stored in the memory of the optical module;

FIG. 12 is a table depicting a storage content of a correction table stored in a memory of an optical module according to a third embodiment of the invention;

FIG. 13 is a table depicting a storage content of a calculation information table stored in the memory of the optical module according to the third embodiment of the invention;

DESCRIPTION OF EMBODIMENTS

A detailed description will be given of a correction device and a correction method for a light reception power monitor in an optical module according to each embodiment of the present invention with reference to each embodiment and the accompanying drawings.

First Embodiment

Figure 1:
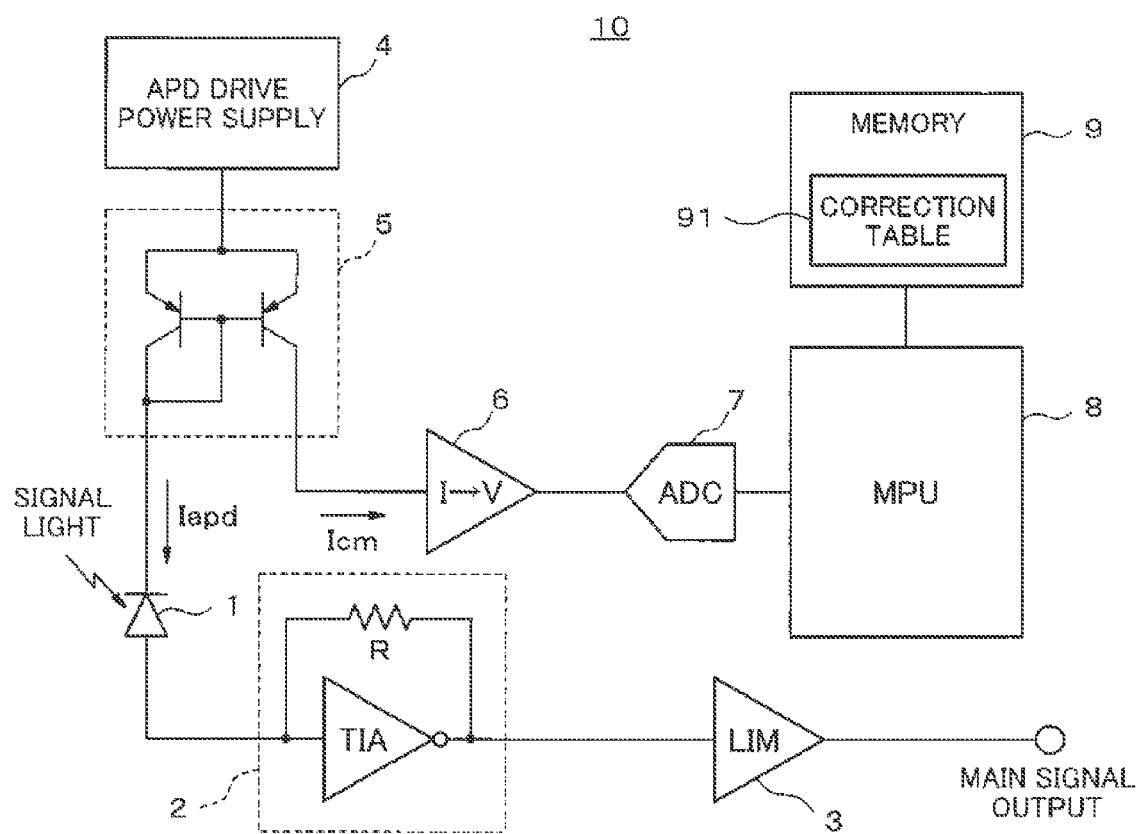
FIG. 1 is a block diagram of an optical module according to a first embodiment of the present invention.

FIG. 1 is a block diagram of an optical module 10 according to a first embodiment of the present invention. The optical module 10 includes an APD (Avalanche Photodiode) 1, a TIA (Transimpedance Amplifier) 2, a LIM (Limiting Amplifier) 3, an ADP drive power supply 4, a current mirror circuit 5, a current voltage conversion circuit 6, an A/D converter 7, an MPU 8, and a memory 9. The memory 9 has a correction table 91. The optical module 10 is provided with a light reception function for converting signal light received by the APD 1 into a main signal output and a light reception power monitor function for measuring light reception power of the APD 1.

The APD 1 as a light receiving element outputs a current Iapd corresponding to received signal light. The TIA 2 as a pre-amplifier amplifies the current Iapd generated by the APD 1 with a gain proportional to a resistance value of a feedback resistor R to convert into a voltage signal. The LIM 3 as a post-amplifier amplifies the output signal of the TIA 2 up to a predetermined amplitude to generate a main signal output.

The current minor circuit 5 operates the APD drive power supply as a constant voltage source to drive the APD 1 and also generates a current Icm proportional to the current Iapd generated in the APD 1 to output the current Icm to the current voltage conversion circuit 6. The current voltage conversion circuit 6 converts the current Icm into a voltage signal to output the voltage signal to the A/D converter 7.

Figure 2:
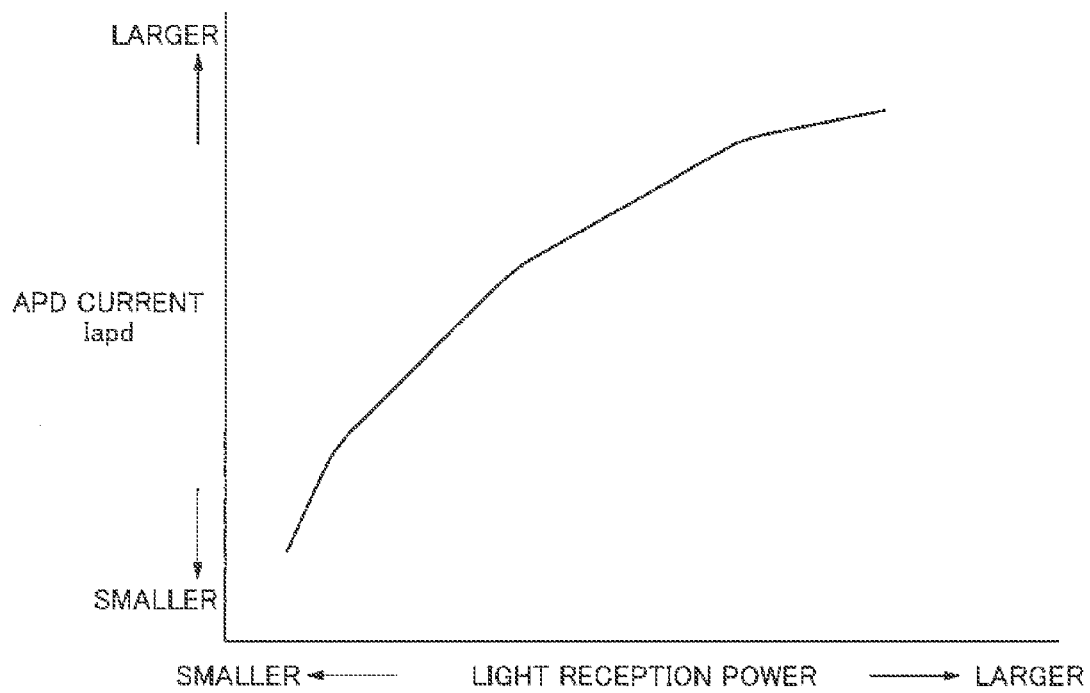
FIG. 2 is a characteristic chart depicting a correlation between light reception power and output current of an APD in the optical module.

The A/D converter 7 converts the voltage signal of the current voltage conversion circuit 6 into a digital value to output the digital value to the MPU 8. The MPU 8 executes correction processing for correcting the digital value of the A/D converter 7 (hereinafter referred to as ADC measured value ad) in accordance with an actual value of light reception power of the signal light. The correction processing corrects an error between the actual value of light reception power of the input signal light of the APD 1 and the ADC measured value ad. FIG. 2 depicts a correlation between actual value of light reception power and ADC measured value ad, in which a nonlinear correlation set in advance is established between both values. In the correction processing executed by the MPU 8, a correction value corresponding to an ADC measured value ad is calculated using a table set in advance on the basis of the correlation depicted in FIG. 2 and calculation information.

A description will be given of an outline of the correction processing executed by the MPU 8, with reference to FIGS. 2 and 3. FIG. 2 is a characteristic chart depicting a relationship between light reception power of the APD 1 and output current Iapd of the APD 1, in which horizontal axis represents light reception power of the APD 1 and vertical axis represents output current Iapd of the APD 1. In general, a nonlinear correlation depicted in FIG. 2 is established between light reception power of the APD 1 and output current Iapd of the APD 1. In addition, the correlation of FIG. 2 includes also influence of dark current of the APD 1.

Figure 3:
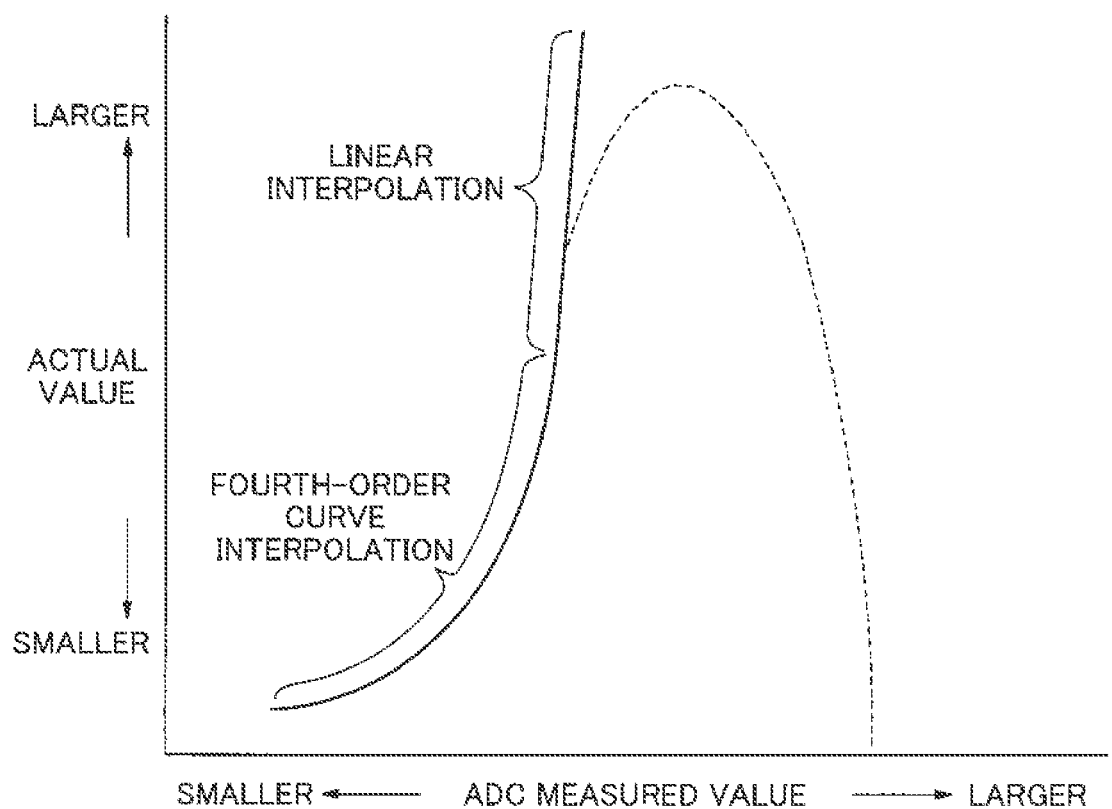
FIG. 3 is a characteristic chart depicting a correlation between ADC measured value and actual value of light reception power in the optical module.

FIG. 3 is a characteristic chart depicting a relationship between ADC measured value ad and actual value, in which horizontal axis represents ADC measured value ad and vertical axis represents actual value. In the characteristic chart of FIG. 3, a fourth-order curve interpolation relationship is established between ADC measured value ad and actual value.

Actual value=$A \times (ADC$ measured value ad$)^4 + B \times (ADC$ measured value ad$)^3 + C \times (ADC$ measured value$)^2 + D \times (ADC$ measured value ad$) + E$ When the correlation depicted in FIG. 3 is between ADC measured values ad and actual values, resolution needs to be increased for a segment in which a change in the actual values is small relative to a change in the ADC measured values ad than for a segment in which a change in the actual values is greater than a change in the ADC measured values. Since the MPU 8 acquires a correction value for an ADC measured value ad by referring to the correction table 91 in accordance with the correlation between the ADC measured values ad and the actual values, processing load can be reduced and precision of correction processing can be improved. Additionally, fourth-order curve interpolation always has an inflection point and thus does not represent monotonic increase. As depicted in FIG. 3, combining monotonically increasing linear interpolation with fourth-order curve interpolation to prevent the curve from passing through the inflection point enables avoidance of unexpected erroneous operation.

The correction table 91 is a table storing a correspondence relation between a plurality of ADC measured values and a plurality of actual values (i.e., correction values) of light reception power of the APD 1. The correction table 91 serves as a lookup table. The MPU 8 refers to reference points of ADC measured values (hereinafter referred to as ADC measured values $M_k$) specified in the correction table 91 to search an ADC measured value $M_k$ that matches an ADC measured value ad of the A/D converter 7. The sign "k" of the ADC measured value $M_k$ represents an element number in the correction table 91. The MPU 8 searches an ADC measured value $M_k$ matching the ADC measured value ad of the A/D converter 7 from the correction table 91 to acquire a correction value Gk corresponding to the ADC measured value $M_k$, as an actual value of the light reception power. When the MPU 8 finds the ADC measured value $M_k$ matching the ADC measured value ad of the A/D converter 7, the MPU 8 reads the correction value $G_k$ corresponding to the ADC measured value $M_k$ from the correction table 91 and can thereby acquire the correction value corresponding to the ADC measured value ad.

In the present embodiment, in order to save a memory capacity of the optical module 10, the number of ADC measured values $M_k$ stored in the correction table 91 is reduced as compared to the number of ADC measured values ad of the A/C converter 7 represented by numbers of bits. In other words, the correction table 91 stores a smaller number of ADC measured values $M_k$ than the number of ADC measured values ad. Accordingly, when the MPU 8 executes searching in the correction table 91, it happens that the ADC measured value ad does not match any ADC measured value $M_k$. In this case, the MPU 8 executes an interpolation calculation in accordance with a linear calculation formula to calculate a correction value corresponding to the ADC measured value ad.

Next, the correction table 91 will be described with reference to FIG. 4. The correction table 91 depicted in FIG. 4 is created so as to be suited to a case in which the A/D converter 7 that has a resolution of 12 bits converts an input voltage into an ADC measured value ad in a range of from "0" to "4095".

In the correction table of FIG. 4, in order to precisely correct light reception power when an input is small, intervals between 64 ADC measured values $M_k$ are set not to be equal but unequal. Specifically, four different kinds of intervals are used to set the intervals between the ADC measured values $M_k$. Herein, the correction table 91 has four regions ranging from region 1 to region 4 corresponding to the four different intervals. In addition, correction values $G_{k1}, G_{k2}, G_{k3},$ and $G_{k4}$ are correlated with the ADC measured values $M_k$ of the regions 1, 2, 3, and 4. The correction values $G_{k1}, G_{k2}, G_{k3},$ and $G_{k4}$ are collectively referred to as correction value $G_{kx}$ (x=1, 2, 3, or 4). In this case, in the region 1, the interval between the ADC measured values $M_k$ is set to "1"; in the region 2, the interval between the ADC measured values $M_k$ is set to "4"; in the region 3, the interval between the ADC measured values $M_k$ is set to "16"; and in the region 4, the interval between the ADC measured values $M_k$ is set to "240". Additionally, the region 1 has element numbers of from "1" to "16"; the region 2 has element numbers of from "17" to "32"; the region 3 has element numbers of from "33" to "48"; and the region 4 has element numbers of from "49" to "64".

In the region 1, ADC measured values $M_k$ corresponding to element numbers k (k=1 to 16) are correlated with a correction value $G_{k1}$. That is, in the region 1, ADC measured value $M_k$=k1, and k1=k. In other words, in the region 1, it is determined such that the interval between the ADC measured values $M_k$ is "1", and ADC measured value $M_k$=k1. Specifically, the ADC measured values $M_k$ of k=1 to 16 are integers of from "1" to "16" and the interval between the values is "1". Additionally, in the region 1, the correction value $G_{k1}$ is correlated with the ADC measured values $M_k$. Thus, the correction value $G_{k1}$ of the correction table 91 corresponds to the ADC measured values $M_k$="1" to "16".

In the region 2, ADC measured values $M_k$ corresponding to element numbers k (k=17 to 32) are correlated with a correction value $G_{k2}$. That is, in the region 2, ADC measured value $M_k$=k2, and k2=4×(k−16)+16. In other words, in the region 2, it is determined such that the intervals between the ADC measured values $M_k$ are "4", and ADC measured value $M_k$=k2. Specifically, the ADC measured values $M_k$ of k=17 to 32 are integers of "20", "24", "28", "32", "36", "40", "44", "48", "52", "56", "60", "64", "68", "72", "76", and "80", and the interval between the values is "4". Additionally, in the region 2, the correction value $G_{k2}$ is correlated with the ADC measured values $M_k$. Thus, the correction value $G_{k2}$ of the correction table 91 corresponds to the ADC measured values $M_k$=20, 24, ... 76, and 80.

In the region 3, ADC measured values $M_k$ corresponding to element numbers k (k=33 to 48) are correlated with a correction value $G_{k3}$. That is, in the region 3, ADC measured value $M_k$=k3, and k3=16 ×(k−32)+80. In other words, in the region 3, it is determined such that the interval between the ADC measured values $M_k$ is "16", and ADC measured value $M_k$=k3. Specifically, the ADC measured values $M_k$ of k=33 to 48 are integers of "96", "112", "128", "144", "160", "176", "192", "208", "224", "240", "256", "272", "288", "304", "320", and "336" and the interval between the values is "16". Additionally, in the region 3, the correction value $G_{k3}$ is correlated with the ADC measured values $M_k$. Thus, the correction value $G_{k3}$ of the correction table 91 corresponds to the ADC measured values $M_k$=96, 112, ... 320, and 336.

In the region 4, ADC measured values $M_k$ corresponding to element numbers k (k=49 to 64) are correlated with a correction value $G_{k4}$. That is, in the region 4, ADC measured value $M_k$=k4, and k4=240 ×(k−48)+336. In other words, in the region 4, it is determined such that the interval between the ADC measured values $M_k$ is "240", and ADC measured value $M_k$=k4. Specifically, the ADC measured values $M_k$ of k=49 to 64 are integers of "576", "816", "1056", "1296", "1536", "1776", "2016", "2256", "2496", "2736", "2976", "3216", "3456", "3696", "3936", and "4176", and the interval between the values is "240". Additionally, in the region 4, the correction value $G_{k4}$ is correlated with the ADC measured values $M_k$. Thus, the correction value $G_{k4}$ of the correction table 91 corresponds to the ADC measured values $M_k$=576, 816, ... 3936, and 4176.

In the correction table 91, in the correlation between ADC measured values ad and current values depicted in FIG. 3, the ADC measured values $M_k$ are determined such that the interval between the ADC measured values $M_k$ is smaller for a segment in which a change in the current values is small relative to a change in the ADC measured values ad (for a segment of FIG. 3 in which the ADC measured value ad is small and the current value is also small) than for a segment in which the change in the current values is large relative to the change in the ADC measured values ad (for a segment of FIG. 3 in which the ADC measured values ad are large and the current values are also large).

Usually, the light reception power monitor function in the optical module 10 requires a light reception range of about from 20 to 30 dB. Thus, the resolution of the A/C converter 7 is generally set to be 10 bits or more. When an ADC measured value Mk and a correction value (i.e., a current value) of light reception power of the APD 1 are assumed to be corresponding to each other in a relationship of 1:1, the correction table 91 needs to include a number of correction values represented by 10 bits or more, so that large memory capacity is necessary. On the other hand, in the present embodiment, to save memory capacity, the number of combinations of reference values and correction values (i.e., element numbers k) specified in the correction table 91 is reduced and correction values corresponding to the number of correction values reduced are calculated using a linear calculation predetermined in advance. Although 4096 correction values are necessary in order to correlate correction values with the ADC measured values Mk in the relationship of 1:1, the number of correction values in the correction table 91 depicted in FIG. 4 has been reduced down to 64 (k=64).

Figure 5:
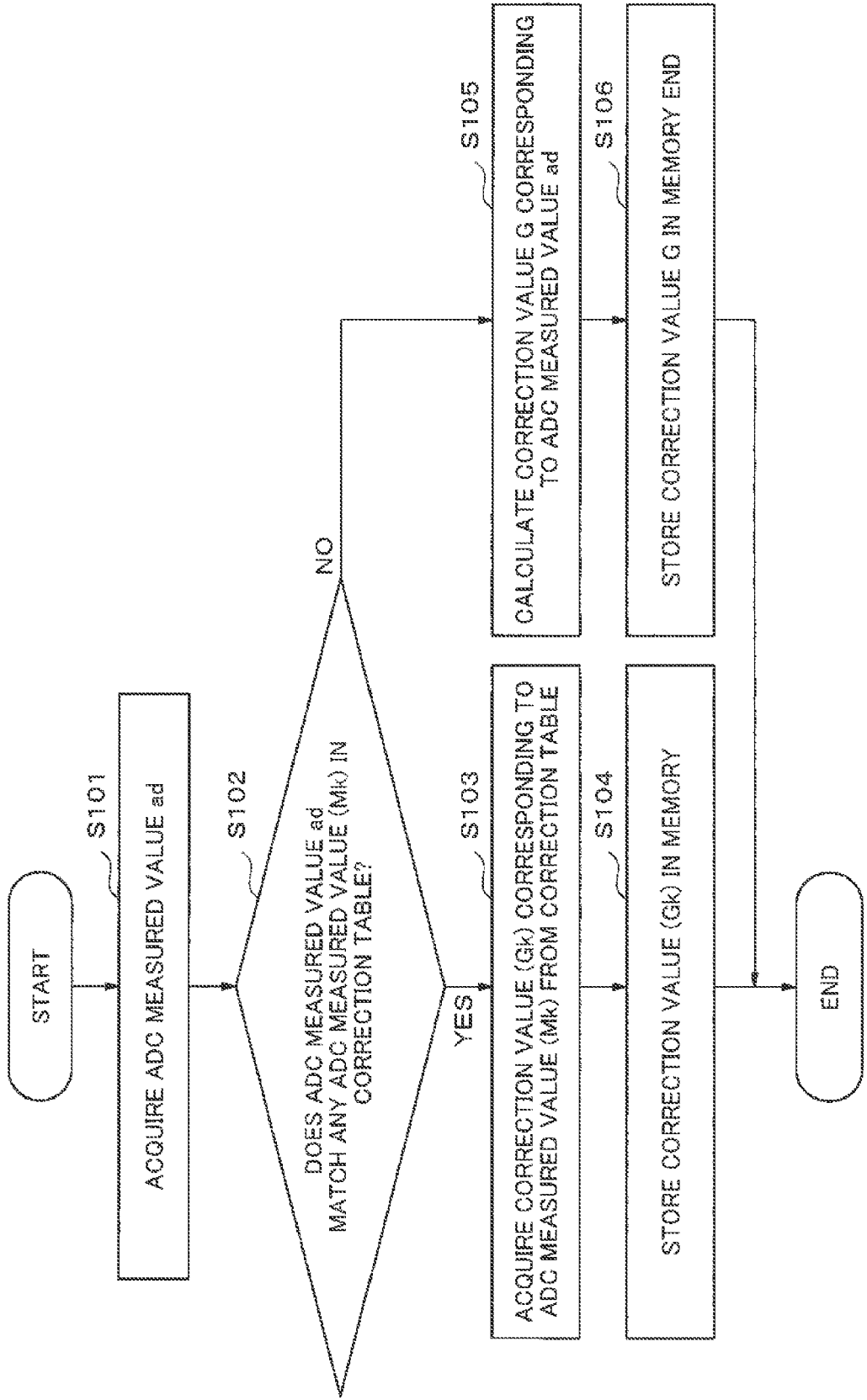
FIG. 5 is a flowchart depicting correction processing executed by an MPU of the optical module.

FIG. 5 will be referred to next to describe the correction processing executed by the MPU 8 (i.e. processing in which the MPU 8 calculates a correction value $G_{kx}$ by inputting an ADC measured value ad from the A/D converter 7).

(Step S101)
The MPU 8 inputs an ADC measured value ad from the A/D converter 7.

(Step S102)
The MPU 8 refers to the correction table 91 to determine whether or not the ADC measured value ad matches any of the 64 ADC measured values Mk in the correction table 91.

(Step S103)
When it is determined at the step S102 that the ADC measured value ad matches any of the 64 ADC measured values Mk in the correction table 91 (i.e. when a determination result of the step S102 is "YES"), the MPU 8 acquires a correction value $G_{kx}$ to which the same element number k as that of the ADC measured value Mk is assigned, from the correction table 91.

(Step S104)
At the step S103, the MPU 8 acquires a correction value $G_{k1}$, $G_{k2}$, $G_{k3}$, or $G_{k4}$ from the correction table 91 and stores any one of the correction values as a correction value for the ADC measured value ad in a predetermined region in the memory 9.

For example, when the ADC measured value ad input by the MPU 8 from the A/D converter 7 is "1", an ADC measured value $M_1$ corresponding to the ADC measured value ad is specified in the correction table 91, so that the MPU 8 acquires "a correction value $G_{k1}$" corresponding to the ADC measured value $M_1$ from the correction table 91. In addition, when the ADC measured value ad input by the MPU 8 from the A/D converter 7 is "128", an ADC measured value $M_{35}$ corresponding to the ADC measured value ad is specified in the correction table 91, so that the MPU 8 acquires "a correction value $G_{128}$" corresponding to the ADC measured value $M_{35}$ from the correction table 91. Furthermore, when the ADC measured value ad input by the MPU 8 from the A/D converter 7 is "816", an ADC measured value $M_{50}$ corresponding to the ADC measured value ad is specified in the correction table 91, so that the MPU 8 acquires "a correction value $G_{816}$" corresponding to the ADC measured value $M_{50}$ from the correction table 91.

Figure 6:
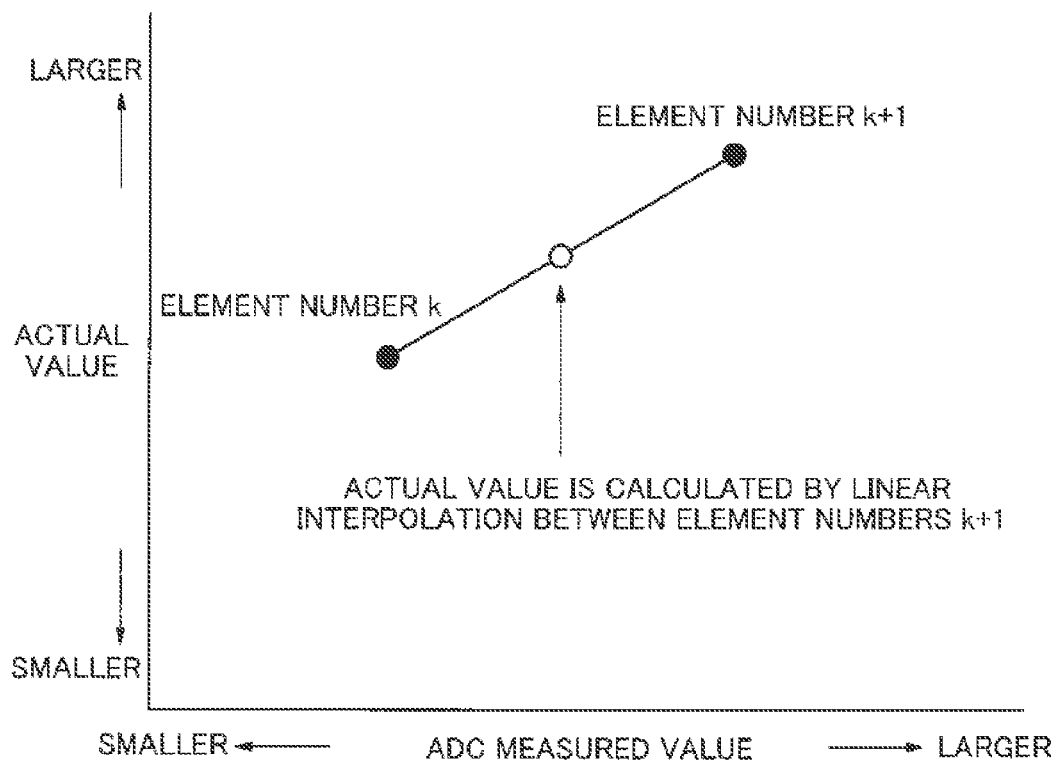
FIG. 6 is a characteristic chart illustrating linear interpolation executed by the MPU of the optical module.

(Step S105)
On the other hand, when it is determined at the step S102 that the ADC measured value ad does not match any of the 64 ADC measured values $M_k$ in the correction table 91 (i.e. when a determination result of the step S102 is "NO"), the MPU 8 calculates a correction value for the ADC measured value ad by a linear interpolation. Specifically, the MPU 8 compares the ADC measured value ad input from the A/D converter 7 with the ADC measured values $M_k$ and determines an element number k corresponding to the ADC measured value ad. For example, the MPU 8 determines a range of from an ADC measured value $M_k$ corresponding to the ADC measured value ad to less than an ADC measured value $M_{k+1}$ and executes a linear interpolation on the basis of the ADC measured value $M_k$ and the ADC measured value $M_{k+1}$. FIG. 6 depicts an outline of the linear interpolation executed by the MPU 8.

For example, when the ADC measured value ad input by the MPU 8 from the A/D converter 7 is "81", an ADC measured value $M_k$ corresponding to the ADC measured value ad is not specified in the correction table 91 and thus the MPU 8 determines an element number k corresponding to the ADC measured value ad ="81". The ADC measured value ad="81" is included in a range of from the ADC measured value $M_{32}$="80" to less than the ADC measured value $M_{33}$="96". Accordingly, the MPU 8 calculates a correction value for the ADC measured value ad ="81" on the basis of the ADC measured value $M_{32}$="80" and the ADC measured value $M_{33}$="96". The linear interpolation is known and thus a detailed description thereof will be omitted.

(Step S106)

The MPU 8 stores the correction value G obtained at the step S105 in a predetermined region of the memory 9.

Second Embodiment

Figure 7:
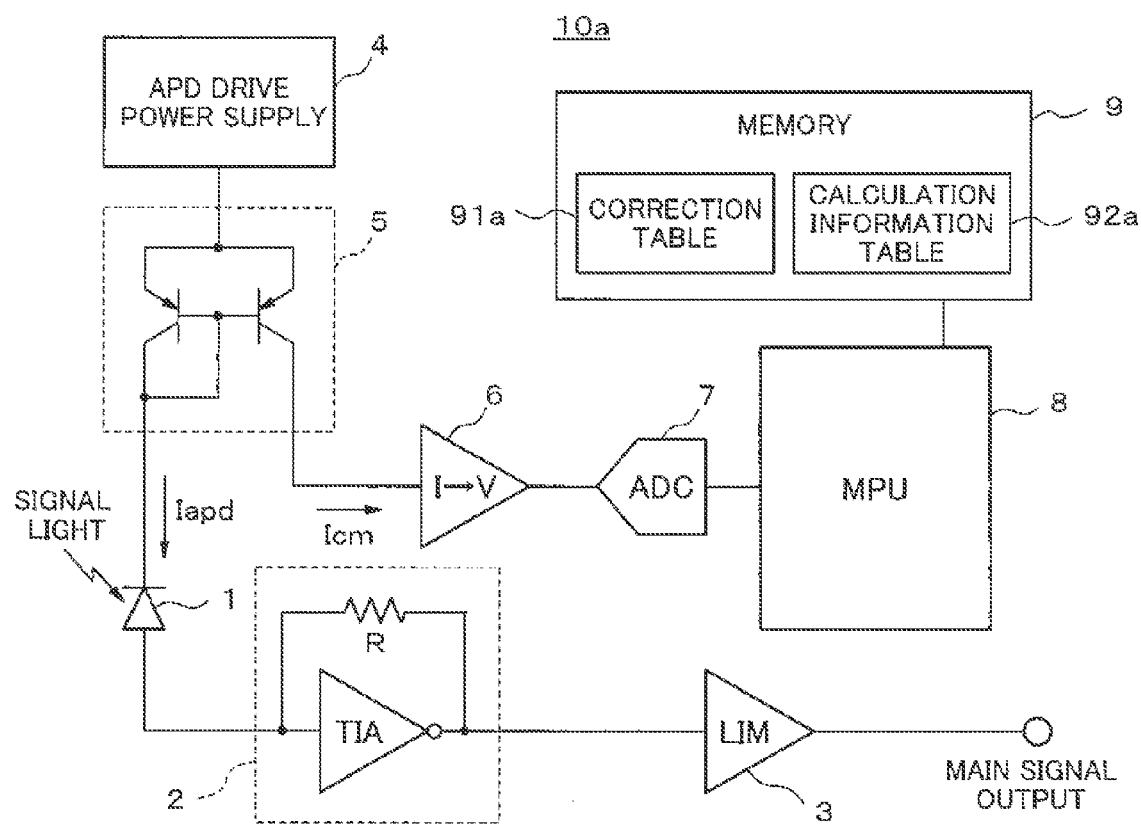
FIG. 7 is a block diagram of an optical module according to a second embodiment of the invention.

Next, a detailed description will be given of a second embodiment of the present invention. FIG. 7 is a block diagram of an optical module 10a according to the second embodiment of the invention. A basic structure of the optical module 10a according to the second embodiment is the same as that of the optical module 10 according to the first embodiment. Thus, the same reference numerals are given to constituent elements of the module 10a and a description thereof will be omitted. Unlike the optical module 10, the memory 9 of the optical module 10a stores two kinds of tables, i.e. a correction table 91a and a calculation information table 92a.

FIG. 8 is a table depicting a storage content of the correction table 91a. The correction table 91a of FIG. 8 is created in connection with a case in which the A/D converter 7 has a resolution of 12 bits and converts an input voltage into an ADC measured value ad in a range of from "0" to "4095". The correction table 91a is a table storing a plurality of ADC measured values $M_k$ and a plurality of actual values (i.e., correction values) of light reception power of the APD 1 by correlating the values with each other. The correction table 91a serves as a lookup table. In addition, ADC measured value $M_k$=64×(k−1)+1. Specifically, in the correction table 91a, the intervals between the ADC measured values $M_k$ are "64", and ADC measured values $M_k$ of k=1 to 16 are integers of "1", "65", "129", . . . "64×(k−1)+1", . . . "3869", and "4033". In the correction table 91a, correction values $G_k$ are correlated with the ADC measured values $M_k$. That is, the correction values $G_k$ specified in the correction table 91a correspond to the ADC measured values $M_k$="1", "65", "129", . . . "64×(k−1)+1", . . . "3869", and "4033".

In the correction table 91a of FIG. 8, the intervals between the plurality of ADC measured values $M_k$ are set to "64". That is, each value of the ADC measured values $M_k$ is sequentially set to an ADC measured value $M_k$="1" of element number 1, an ADC measured value $M_k$="65" of element number 2, and so on. An ADC measured value $M_k$ corresponding to an element number k is represented by "64+(k−1)+1". In addition, ADC measured values $M_k$ correspond to correction values $G_k$, and element numbers k represent integers of from "1" to "64".

FIG. 9 is a table depicting a storage content of a calculation information table 92a. The calculation information table 92a of FIG. 9 includes the same numbers of elements as those in the correction table 91a of FIG. 8. The calculation information table 92a describes a nonlinear calculation formula to be applied to an ADC measured value ad having a value between an ADC measured value $M_k$ and an ADC measured value $M_{k+1}$ according to each element number k. In FIG. 9, the nonlinear calculation formula is represented as follows:

$$G_{k\_k+1} = A_{k\_k+1} \times (M_{k\_k+1})^4 + B_{k\_k+1} \times (M_{k\_k+1})^3 + C_{k\_k+1} \times (M_{k\_k+1})^2 + D_{k\_k+1} \times (M_{k\_k+1}) + E_{k\_k+1}$$

In the above formula, $G_{k\_k+1}$ represents a correction value after the interpolation calculation, and $M_{k\_k+1}$ represents an ADC measured value ad. In addition, $A_{k\_k+1}$, $B_{k\_k+1}$, $C_{k\_k+1}$, $D_{k\_k+1}$, and $E_{k\_k+1}$ represent constant values determined on the basis of the correlation depicted in FIG. 2. The subscript "$_{k\_k+1}$" indicates that the ADC measured value ad is a value between an ADC measured value $M_k$ and an ADC measured value $M_{k\_k+1}$ in the correction table 91a. In other words, the ADC measured value $M_{k\_k+1}$ is an ADC measured value ad that does not match any of the ADC measured values $M_k$ specified in the correction table 91a and is between the ADC measured value $M_k$ and the ADC measured value $M_{k+1}$. Accordingly, the calculation information table 92a indicates that the correction point $G_{k\_k+1}$ of the ADC measured value $M_{k\_k+1}$ is calculated by the above-mentioned calculation formula. Additionally, in FIG. 9, the subscript "$_{64\_E}$" indicates that the ADC measured value ad belongs to a range up to a maximum value larger than an ADC measured value $M_k$ (=$M_{64}$) of the largest element number "64" in the correction table 91a.

In the calculation information table 92a, when basic elements of the plurality of calculation formulae are all the same (i.e., in the case of the above-mentioned calculation formula $G_{k\_k+1}$), the table can be formed by the element numbers k and the constant values $A_{k\_k+1}$, $B_{k\_k+1}$, $C_{k\_k+1}$, $D_{k\_k+i}$, and $E_{k\_k+1}$. In other words, without describing the general form of the calculation formula, only parameters may be provided in the calculation information table 92a. In addition, it is unnecessary to create the calculation information table 92a in the form of table, and the calculation information table 92a may be described in a program executed by the MPU 8.

Figure 10:
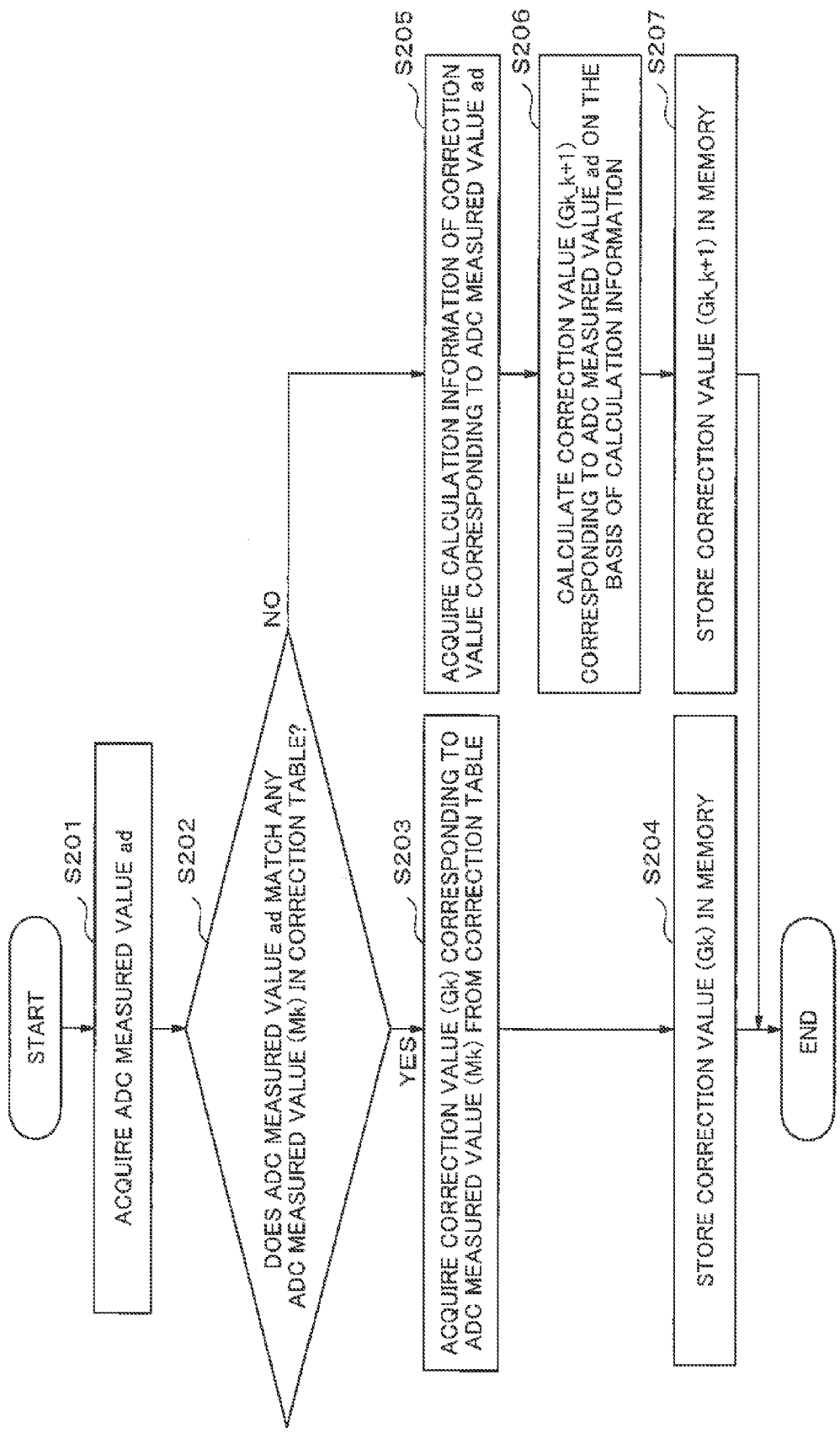
FIG. 10 is a flowchart depicting correction processing executed by an MPU of the optical module.

FIG. 10 will be referred to next to describe the correction processing executed by the MPU 8 (processing in which the MPU 8 calculates a correction value $G_k$ by inputting an ADC measured value ad from the A/D converter 7).

(Step S201)

The MPU 8 inputs an ADC measured value ad from the A/D converter 7.

(Step S202)

The MPU 8 refers to the correction table 91a to determine whether or not the ADC measured value ad input from the A/D converter 7 matches any of the 64 ADC measured values $M_k$ in the correction table 91a.

(Step S203)

When it is determined at the step S202 that the ADC measured value ad matches any of the 64 ADC measured values $M_k$ in the correction table 91a (i.e. when a determination result of the step S202 is "YES"), the MPU 8 acquires a correction value $G_k$ having the same element number k as that of the ADC measured value $M_k$ from the correction table 91a.

(Step S204)

The MPU 8 correlates the correction value $G_k$ acquired from the correction table 91a at the step S203 with the ADC measured value ad to store the value in a predetermined region of the memory 9.

For example, when the MPU 8 inputs an ADC measured value ad "1" from the A/D converter 7, an ADC measured value $M_1$ matching the ADC measured value ad is specified in the correction table 91a, so that the MPU 8 acquires a correction value $G_1$ correlated with the ADC measured value $M_1$ from the correction table 91a. In addition, when the MPU 8 inputs an ADC measured value ad "129" from the A/D converter 7, an ADC measured value $M_3$ matching the ADC measured value ad is specified in the correction table 91a, so that the MPU 8 acquires a correction value $G_3$ correlated with the ADC measured value $M_3$ from the correction table 91a. Furthermore, when the MPU 8 inputs an ADC measured value ad "4033" from the A/D converter 7, an ADC measured value $M_{64}$ matching the ADC measured value ad is specified in the correction table 91a, so that the MPU 8 acquires a correction value $G_{64}$ correlated with the ADC measured value $M_{64}$ from the correction table 91a.

(Step S205)

On the other hand, when it is determined at the step S202 that the ADC measured value ad does not match any of the 64 ADC measured values $M_k$ in the correction table 91a (i.e. when the determination result of the step S202 is "NO"), the MPU 8 refers to the calculation information table 92a to calculate a correction value for the ADC measured value ad.

Specifically, the MPU 8 compares the ADC measured value ad input from the A/D converter 7 with the ADC measured values Mk to determine an element number k corresponding to the ADC measured value ad. For example, the MPU 8 determines a range of from an ADC measured value $M_k$ corresponding to the ADC measured value ad to less than an ADC measured value $M_{k+1}$. The MPU 8 determines an element number k corresponding to the ADC measured value ad to acquire calculation information of a correction value $G_{k\_k+1}$ corresponding to the element number k (i.e., which indicates the range of from the ADC measured value $M_k$ corresponding to the ADC measured value ad to less than the ADC measured value $M_{k+1}$) from the calculation information table 92a. In the present embodiment, the calculation information table 92a stores the calculation formula for calculating the correction value $G_{k\_k+1}$. Thus, the MPU 8 reads the calculation formula for the correction value $G_{k\_k+1}$ corresponding to the element number k from the calculation information table 92a.

For example, the MPU 8 acquires the calculation formula for calculating the correction value $G_{k\_k+1}$ corresponding to the element number k from the calculation information table 92a.

$$G_{k\_k+1}=A_{k\_k+1}\times(ADC\text{ measured value ad})^4+B_{k\_k+1}\times(ADC\text{ measured value ad})^3+C_{k\_k+1}\times(ADC\text{ measured value ad})^2+D_{k\_k+1}\times(ADC\text{ measured value ad})+E_{k\_k+1}$$

For example, when the MPU 8 inputs an ADC measured value ad "80" from the A/D converter 7, an ADC measured value Mk matching the ADC measured value ad is not specified in the correction table 91a. Accordingly, the MPU 8 determines an element number k corresponding to the ADC measured value ad "80". The ADC measured value ad "80" is included in a range of from an ADC measured value $M_2$ "65" to less than an ADC measured value $M_3$ "129". Thus, the MPU 8 determines that the ADC measured value ad "80" corresponds to the element number k="2" and reads the calculation formula of a correction value $G_{2\_3}$ corresponding to the ADC measured value ad from the calculation information table 92a. In this case, the MPU 8 reads the following calculation formula from the calculation information table 92a.

$$G_{2\_3}=A_{2\_3}\times(ADC\text{ measured value ad})^4+B_{2\_3}\times(ADC\text{ measured value ad})^3+C_{2\_3}\times(ADC\text{ measured value ad})^2+D_{2\_3}\times(ADC\text{ measured value ad})+E_{2\_3}$$

(Step S206)

The MPU 8 substitutes the ADC measured value ad "80" input from the A/D converter into the calculation formula of the correction value $G_{2\_3}$ read from the calculation information table 92a to calculate a correction value corresponding to the ADC measured value ad.

When only the constant values ($A_{k\_k+1}$, $B_{k\_k+1}$, $C_{k\_k+1}$, $D_{k\_k+1}$, and $E_{k\_k+1}$) used in the calculation formula of a correction value are specified in the calculation information table 92a, the MPU 8 reads only constant values corresponding to the element number k of the ADC measured value ad from the calculation information table 92a. Then, the MPU 8 substitutes the constant values and the ADC measured value ad into a calculation formula determined in advance to calculate a correction value $G_{k\_k+1}$ corresponding to the ADC measured value ad.

$$G_{k\_k+1}=A_{k\_k+1}\times(ADC\text{ measured value ad})^4+B_{k\_k+1}\times(ADC\text{ measured value ad})^3+C_{k\_k+1}\times(ADC\text{ measured value ad})^2+D_{k\_k+1}\times(ADC\text{ measured value ad})+E_{k\_k+1}$$

(Step S207)

The MPU 8 stores the correction value $G_{k\_k+1}$ calculated at the step S206 in a predetermined region of the memory 9.

Figure 11:
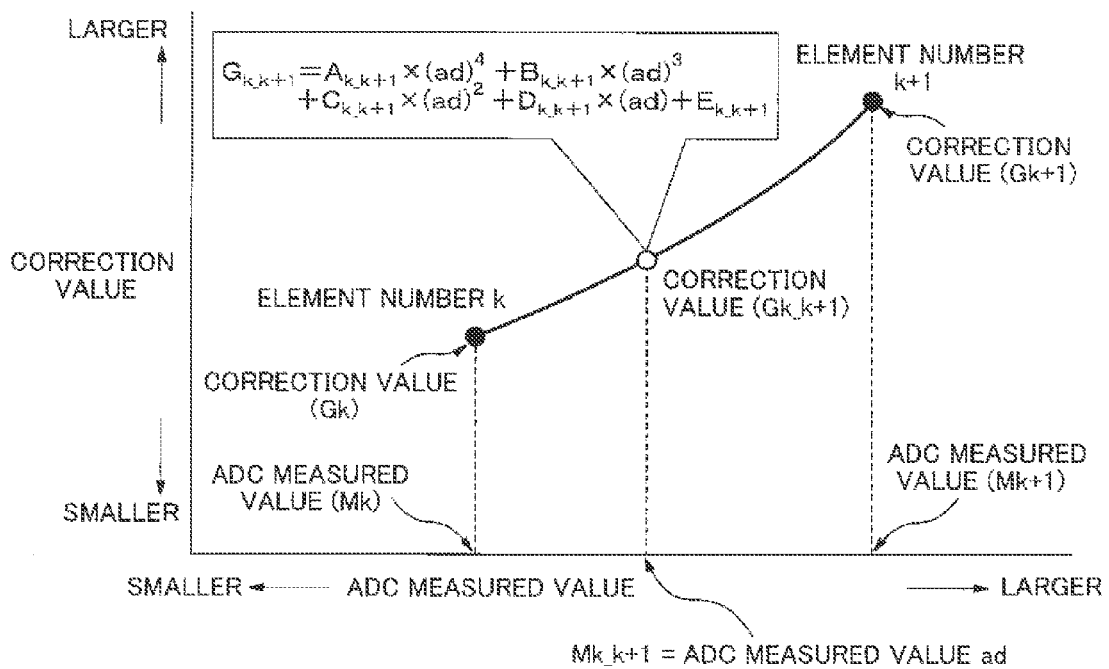
FIG. 11 is a characteristic chart for illustrating a nonlinear interpolation function based on the calculation information table.

FIG. 11 will be referred to next to describe an execution example of the correction processing by the MPU 8 depicted in FIG. 10. FIG. 11 is a characteristic chart depicting a relationship between ADC measured value ad and correction value. For example, when an ADC measure value ad matches an ADC measured value $M_k$ in the correction table 91a (i.e. when the "ADC measured value ad"=the "ADC measured value $M_k$"), the MPU 8 acquires a correction value $G_k$ from the correction table 91a at the step S203. In addition, when an ADC measure value ad matches an ADC measured value $M_{k+1}$ in the correction table 91a (i.e. when the "ADC measured value ad"=the "ADC measured value $M_{k+1}$"), the MPU 8 acquires a correction value $G_{k+1}$ from the correction table 91a at the step S203.

On the other hand, when an ADC measured value ad is between an ADC measured value $M_k$ and an ADC measured value $M_{k+1}$ in the correction table 91a, the MPU 8 acquires, of the plurality of ADC measured values $M_k$ specified in the correction table 91a, an ADC measured value $M_k$ smaller than and closest to the ADC measured value ad, from the correction table 91a at the step S205. The MPU 8 determines that the element number k of the ADC measured value $M_k$ is an element number k of the ADC measured value ad. The MPU 8 refers to the calculation information table 92a on the basis of the element number k to acquire calculation information corresponding to the element number k. Then, at the step S206, the MPU 8 calculates a correction value $G_{k+1}$ of the ADC measured value ad using an interpolation calculation depicted in FIG. 11. In this way, the MPU 8 can obtain the correction value $G_k$, $G_{k+1}$, or $G_{k\_k+1}$ according to the ADC measured value ad.

The correction value $G_k$ or $G_{k\_k+1}$ stored in the memory 9 at the step S204 or step S208 may be processed into an average value or an "OMA (Optical Modulation Amplitude)" using a plurality of correction values by the MPU 8 and then transmitted, in response to a request from, for example, a terminal device (not shown) outside the optical module 10a, to the terminal device via a signal line.

At step S206, the interpolation function executed by the MPU 8 does not necessarily have to be a fourth order function and, for example, can be a third order or lower-order function or a linear function by setting the coefficient $A_{k\_k+1}$, $B_{k\_k+1}$, $C_{k\_k+1}$, or $D_{k\_k+1}$ to "0". Alternatively, as depicted in FIG. 3, a flexible interpolation function may be set such that a range for a relatively small ADC measured value ad is interpolated using a fourth order curve, whereas a range for a relatively large ADC measured value ad is linearly interpolated.

Third Embodiment

Next, a description will be given of an optical module 10b (not shown) according to a third embodiment of the present invention. A basic structure of the optical module 10b of the third embodiment is the same as that of the optical module 10a of the second embodiment and thus a detailed description thereof will be omitted. Unlike the optical module 10a (see FIG. 7), the optical module 10b stores the correction table 91a and the calculation information table 92b in the memory 9.

FIG. 12 depicts a storage content of the correction table 91b stored in the memory 9 of the optical module 10b according to the third embodiment. Like the correction table 91a according to the second embodiment (see FIG. 8), the correction table 91b according to the third embodiment is created in connection with the A/D converter 7 having a resolution of 12 bits. In the correction table 91b, in order to precisely correct light reception power when an input is small, the intervals between 64 ADC measured values $M_k$ are set not to be equal but unequal. As depicted in FIG. 12, the correction table 91b sets four kinds of intervals for the ADC measured values $M_k$ and has four regions. Specifically, in region 1, the interval between the ADC measured values $M_k$ is "1"; in region 2, the interval between the ADC measured values $M_k$ is "4"; in region 3, the interval between the ADC measured values $M_k$ is "16"; and in region 4, the interval between the ADC measured values $M_k$ is "240". Herein, the region 1 corresponds to the element numbers k=1 to 16; the region 2 corresponds to the element numbers k=17 to 32; the region 3 corresponds to the element numbers k=33 to 48; and the region 4 corresponds to the element numbers k=49 to 64.

In the region 1, ADC measured values $M_k$ corresponding to the element numbers k (k=1 to 16) are correlated with a correction value $G_{k1}$. That is, in the region 1, ADC measured value $M_k$=k1 and k1=k hold. In other words, in the region 1, it is determined such that the intervals between the ADC measured values $M_k$ are "1", and ADC measured value $M_k$=k1. Specifically, the ADC measured values $M_k$ of k=1 to 16 are integers of from "1" to "16" and the intervals between the values are "1". Additionally, in the region 1, the correction value $G_{k1}$ is correlated with the ADC measured values $M_k$. Thus, the correction value $G_{k1}$ of the correction table 91b corresponds to the ADC measured values $M_k$="1" to "16".

In the region 2, ADC measured values $M_k$ corresponding to the element numbers k (k=17 to 32) are correlated with a correction value $G_{k2}$. That is, in the region 2, ADC measured value $M_k$=k2, and k2=4×(k−16)+16. In other words, in the region 2, it is determined such that the intervals between the ADC measured values $M_k$ are "4", and ADC measured value $M_k$=k2. Specifically, the ADC measured values $M_k$ of k=17 to 32 are integers of "20", "24", "28", "32", "36", "40", "44", "48", "52", "56", "60", "64", "68", "72", "76", and "80", and the intervals between the values are "4". Additionally, in the region 2, the correction value $G_{k2}$ is correlated with the ADC measured values $M_k$. Thus, the correction value $G_{k2}$ of the correction table 91b corresponds to the ADC measured values $M_k$="20", "24", ... "76", and 80".

In the region 3, ADC measured value $M_k$ corresponding to the element numbers k (k=33 to 48) are correlated with a correction value $G_{k3}$. That is, in the region 3, ADC measured value $M_k$=k3, and k3=16×(k−32)+80. In other words, in the region 3, it is determined such that the intervals between the ADC measured values Mk are "16", and ADC measured value $M_k$=k3. Specifically, the ADC measured values $M_k$ of k=33 to 48 are integers of "96", "112", "128", "144", "160", "176", "192", "208", "224", "240", "256", "272", "288", "304", "320", and "336", and the intervals between the values are "16". Additionally, in the region 3, the correction value $G_{k3}$ is correlated with the ADC measured values $M_k$. Thus, the correction value $G_{k3}$ of the correction table 91b corresponds to the ADC measured values $M_k$="96", "112", ... "320", and "336".

In the region 4, ADC measured values $M_k$ corresponding to the element numbers k (k=49 to 64) are correlated with a correction value $G_{k3}$. That is, in the region 4, ADC measured value $M_k$=k4, and k4=240×(k−48)+336. In other words, in the region 4, it is determined such that the intervals between the ADC measured values $M_k$ are "240", and ADC measured value $M_k$=k4. Specifically, the ADC measured values $M_k$ of k=49 to 64 are integers of "576", "816", "1056", "1296", "1536", "1776", "2016", "2256", "2496", "2736", "2976", "3216", "3456", "3696", "3936", and "4176", and the intervals between the values are "240". Additionally, in the region 4, the correction value $G_{k4}$ is correlated with the ADC measured values $M_k$. Thus, the correction value $G_{k4}$ of the correction table 91b corresponds to the ADC measured values $M_k$="576", "816", ... "3936", and "4176".

Figure 14:
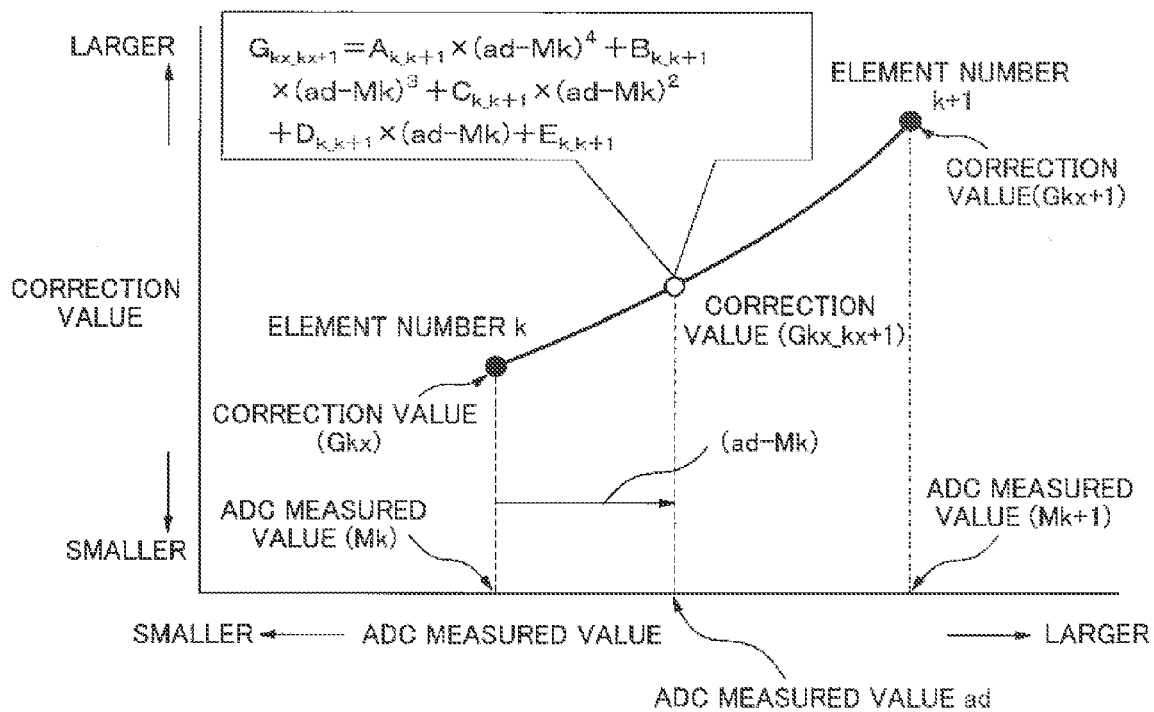
FIG. 14 is a characteristic chart for illustrating a nonlinear interpolation function based on the calculation information table.

FIGS. 13 and 14 will be referred to next to describe a nonlinear interpolation function according to the present embodiment. FIG. 13 depicts a storage content of the calculation information table 92b, and FIG. 14 depicts a relationship between ADC measured value ad and a correction value based on a nonlinear interpolation function in the calculation information table 92b. In the calculation information table 92b of FIG. 13, calculation information of an element number k is set as below. In the calculation information table 92a of FIG. 9, a base of the exponentiation calculation (i.e., a base of the fourth term and the third term) is "ADC measured value ad", whereas in the calculation information table 92b of FIG. 13, the base thereof is "ADC measured value ad−$M_k$".

$$G_{kx\_k+1} = A_{k\_k+1} \times (ADC \text{ measured value ad}-M_k)^4 + B_{k\_k+1} \times (ADC \text{ measured value ad}-M_k)^3 + C_{k\_k+1} \times (ADC \text{ measured value ad}-M_k)^2 + D_{k\_k+1} \times (ADC \text{ measured value ad}-M_k) + E_{k\_k+1}$$

The interpolation calculation for the correction processing using the calculation information table 91b of FIG. 13 is executed as depicted in the characteristic chart of FIG. 14. The MPU 8 refers to the correction table 91b to determine whether or not an ADC measured value ad input from the A/D converter 7 matches any of 64 ADC measured values $M_k$ in the correction table 91b. When the MPU 8 determines that the input ADC measured value ad matches any of the 64 ADC measured values $M_k$ in the correction table 91b, the MPU 8 acquires any one of four correction values $G_{k1}$, $G_{k2}$, $G_{k3}$, and $G_{k4}$ corresponding to the ADC measured value ad from the correction table 91b and stores the correction value as a correction value of the input ADC measured value ad in a predetermined region of the memory 9.

For example, when the ADC measured value ad input from the A/D converter 7 by the MPU 8 is "1", an ADC measured value $M_1$ corresponding to the ADC measured value ad is specified in the correction table 91b, so that the MPU 8 acquires a correction value $G_{k1}$ correlated with the ADC measured value $M_1$ from the correction table 91b. In addition, when the MPU 8 inputs an ADC measured value ad "128", an ADC measured value $M_{35}$ corresponding to the ADC measured value ad is specified in the correction table 91b, so that the MPU 8 acquires a correction value $G_{128}$ correlated with the ADC measured value $M_{35}$ from the correction table 91b. Furthermore, when the MPU 8 inputs an ADC measured value ad "816", an ADC measured value $M_{50}$ corresponding to the ADC measured value ad is specified in the correction table 91b, so that the MPU 8 acquires a correction value $G_{816}$ correlated with the ADC measured value $M_{50}$ from the correction table 91b.

On the other hand, when the MPU 8 determines that the ADC measured value ad does not match any of the 64 ADC measured values $M_k$ in the correction table 91b, the MPU 8 refers to the calculation information table 92b to calculate a correction value for the ADC measured value ad. Specifically, the MPU 8 compares the input ADC measured value ad with the ADC measured values $M_k$ to determine an element number k corresponding to the ADC measured value ad. For example, the MPU 8 determines a range of the input ADC measured value ad from an ADC measured value $M_k$ to less than an ADC measured value $M_{k+1}$. When the element number k corresponding to the ADC measured value ad is determined, the MPU 8 acquires calculation information of a correction value $G_{kx\_kx+1}$ corresponding to the element number k (i.e, an element number indicating the range of from the ADC measured value $M_k$ to less than the ADC measured value $M_{k+1}$) from the calculation information table 92b. The calculation information table 92b stores a calculation formula for calculating the correction value $G_{kx\_kx+1}$. Accordingly, the MPU 8 reads calculation information for the correction value $G_{kx\_kx+1}$ corresponding to the element number k from the calculation information table 92b. Specifically, the MPU 8 acquires calculation information ($G_{kx\_kx+1}=A_{kx\_kx+1}\times$(ADC measured value ad$-M_k)^4+B_{kx\_kx+1}\times$(ADC measured value ad$-M_k)^3+C_{kx\_kx+1}\times$(ADC measured value ad$-M_k)^2+D_{kx\_kx+1}\times$(ADC measured value ad$-M_k)+E_{kx\_kx+1}$) for calculating the correction value $G_{kx\_kx+1}$ of the element number k from the calculation information table 92b.

For example, when the ADC measured value ad input from the A/D converter 7 by the MPU 8 is "81", an ADC measured value $M_k$ matching the ADC measured value ad is not specified in the correction table 91b. Thus, the MPU 8 determines an element number k corresponding to the ADC measured value ad "81". The ADC measured value ad "81" is included in a range of from an ADC measured value $M_{32}$ "80" to less than an ADC measured value $M_{33}$ "96". Accordingly, the MPU 8 determines that the element number k corresponding to the ADC measured value ad "81" is "32" and reads calculation information of a correction value $G_{32\_33}$ corresponding to the ADC measured value ad from the calculation information table 92b. In other words, the MPU 8 acquires calculation information of "$G_{32\_33}=A_{32\_33}\times$(ADC measured value ad$-M_{32})^4+B_{32\_33}\times$(ADC measured value ad$-M_{32})^3+C_{32\_33}\times$(ADC measured value ad$-M_{32})^2+D_{32\_33}\times$(ADC measured value ad$-M_{32})+E_{32\_33}$) from the calculation information table 92b. Then, the MPU 8 substitutes the input ADC measured value ad "81" into the calculation formula of the correction value $G_{32\_33}$ to calculate the correction value $G_{32\_33}$. Specifically, the MPU 8 calculates the correction value $G_{32\_33}$ in accordance with the calculation formula provided below. In this way, the MPU 8 can reduce processing load for executing an exponentiation calculation of the ADC measured value ad by using the predetermined calculation formula.

$$G_{32\_33}=A_{32\_33}\times(81-M_{32})^4+B_{32\_33}\times(81-M_{32})^3+C_{32\_33}\times(81-M_{32})^2+D_{32\_33}\times(81-M_{32})+E_{32\_33}$$

That is, when the ADC measured value ad is between an ADC measured value $M_k$ and an ADC measured value $_{Mk+1}$, the MPU 8 executes an exponentiation calculation using, as a base, a difference "$M_{k\_k+1}-M_k$" between a maximum value of ADC measured values $M_k$ smaller than the ADC measured value ad among the plurality of ADC measured values $M_k$ in the correction table 91b and the ADC measured value ad (i.e. $M_{k\_k+1}$) to calculate the correction value $G_{kx\_kx+1}$.

In the first embodiment to the third embodiment described above, the interval between the ADC measured value $M_k$ and the ADC measured value $M_{k+1}$ is fixed to "64" or the maximum value of the interval is set to "240" (region 4) in the correction tables 91, 91a, and 91b. Accordingly, the difference between the ADC measured value $M_k$ and the ADC measured value ad (i.e. $M_{k\_k+1}$) is less than "64" or less than "240". In other words, the difference between the ADC measured value $M_k$ and the ADC measured value ad can be represented by 6 bits or 8 bits. That is, the interpolation calculation can be done by exponentiation calculation using a 6-bit value or an 8-bit value as a base. Thus, as compared to the case in which the exponentiation calculation is executed using, as the base, the ADC measured value ad (i.e. a 12-bit value) actually input from the A/D converter 7 by the MPU 8 as depicted in FIG. 11, the above-described embodiment executes the exponentiation calculation using the difference "$M_{k\_k+1}-M_k$" as the base, so that processing load of the interpolation function can be reduced. However, in the correction tables 91, 91a, and 91b, it is necessary to set such that the interval between the ADC measured values $M_k$ corresponding to the element numbers k is represented by a number of bits smaller than the number of bits of the resolution of the A/D converter 7. For example, the interval between the ADC measured values $M_k$ is set so as to be equal to or less than "2048" as a maximum value of 11 bits smaller by 1 bit than 12 bits indicating the resolution of the A/D converter 7.

Figure 15:
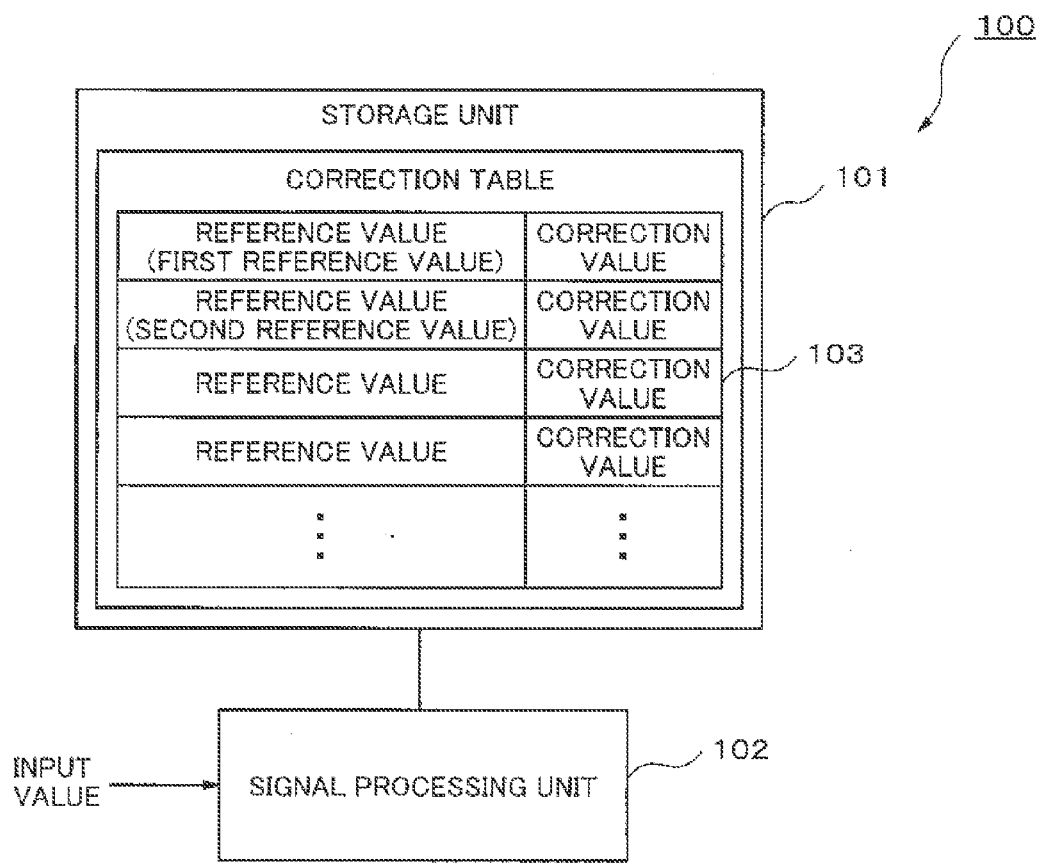
FIG. 15 is a block diagram of a data correction device according to a basic structure of the above embodiment.

FIG. 15 is a block diagram of a data correction device 100 according to a basic structure of the above-described embodiment. The data correction device 100 includes a storage unit 101 and a signal processing unit 102. The storage unit 101 includes a correction table 103 storing a plurality of correction values by correlating with a plurality of reference values on the basis of a correlation between reference values and actual values. The correction table 103 stores the correction values in such a manner that the interval between the reference values is smaller for a segment in which a change in the actual values is small relative to a change in the reference values than for a segment in which the change in the actual values is large relative to the change in the reference values in the correlation between the reference values and the actual values. When an input value (for example, an ADC measured value ad) matches a reference value in the correction table 103, the signal processing unit 102 reads a correction value corresponding to the reference value from the correction table 103. On the other hand, when the input value does not match any of the reference values in the correction table 103, the signal processing unit 102 calculates a correction value corresponding to the input value by a predetermined calculation. The data correction device 100 of FIG. 15 corresponds to the light reception power monitor function unit of the optical module of FIG. 1; the memory unit 101 corresponds to the memory 9; and the signal processing unit 102 corresponds to the MPU 8. Additionally, the correction table 103 corresponds to the correction table 91; the reference values of the correction table 103 correspond to ADC measured values $M_k$; and the correction values correspond to the correction values $G_k$.

As described hereinabove, the present invention can obtain the following advantageous effects:
(1) A light reception power monitor with high speed and high precision can be obtained by setting a desired interpolation function for each of a plurality of regions in a light reception power monitor circuit using APD current.

(2) Nonlinear characteristics established between APD current and light reception power can be easily corrected with high flexibility.
(3) Even in the use of an interpolation method that does not show a monotonic increase, such as fourth-order interpolation, a monotonically increasing function for a linear interpolation or the like can be partially combined therewith. In other words, combining a linear interpolation so that actual values of ADC measured values do not pass through an inflection point of the fourth-order interpolation allows for reduction in restrictions on setting of coefficients in a multi-order interpolation function.

The present invention is not limited to the above-described embodiments. For example, the number of the elements set in the correction tables 91, 91a, and 91b and the calculation information tables 92a and 92b, the intervals between the ADC measured values $M_k$, the order of the nonlinear interpolation function, and the number of parameters for calculating the nonlinear interpolation function can be changed as needed. When a multi-order interpolation function is combined with a first-order interpolation function, the number of parameters for calculation can be reduced to "1" at minimum.

In the above embodiments, the MPU 8 can achieve some of the functions of the correction device for the light reception power monitor by executing the program stored in a nonvolatile memory (not shown). In this case, the program executed by the MPU 8 may be stored in a computer readable storage medium or may be downloaded from a server via a communication channel. Additionally, the optical module 10 includes a computer system thereinside and processing steps of the system are stored in the computer readable storage medium in a program form. Thus, the correction processing of the light reception power monitor can be achieved by causing the computer system to read and execute the program. The term "computer system" encompasses hardware such as a CPU, a memory, and a peripheral device, and software such an operation system (OS). Additionally, the "computer system" encompasses a homepage providing environment/displaying environment when a WWW system is used.

In addition, the program achieving the correction function of the light reception power monitor shown in each of the flowcharts may be recorded in a computer readable storage medium, and then read and executed by the computer system. The "computer readable storage medium" means a writable nonvolatile memory such as a flexible disk, a magneto-optical disk, a ROM, or a flash memory, a portable storage medium such as a CD-ROM, and a storage device such as a hard disk built in a computer system.

In addition, the "computer readable storage medium" encompasses devices maintaining a program for a certain period of time, such as a volatile memory (for example, DRAM) in a computer system serving as a server or a client used when transmitting the program via a network communication channel such as the Internet or a telephone channel. The above-described program may be transmitted to another computer system from a computer system storing the program in a storage device via a transmission medium or via a transmission wave in the transmission medium. The "transmission medium for transmitting the program" means a medium having a function of transmitting information, such as a network (a communication network) such as the Internet, a telephone channel, or a communication channel. In addition, the above-described program may be one that achieves a part of the correction function of the light reception power monitor according to the present invention. Alternatively, the program may be a differential program (or a differential file) that achieves the function of the present invention by a combination of the program and a program that has already been stored in the computer system.

Lastly, the present invention is not limited to the embodiments described above and encompasses various modifications and design changes within the scope of the invention as defined in the appended claims.

INDUSTRIAL APPLICABILITY

The present invention relates to a correction device and a correction method for a light reception power monitor of an optical module used in optical communication equipment and is applied to a technical field for correcting a measured value of light reception power of signal light to an actual value.

REFERENCE SIGNS LIST

1 APD (Avalanche photodiode)
2 TIA (Transimpedance amplifier)
3 LIM (Limiting amplifier)
4 ADP drive power supply
5 Current mirror circuit
6 Current voltage conversion circuit
7 A/D converter
8 MPU
9 Memory
10 Optical module
91, 91a, 91b Correction table
92a, 92b Calculation information table

The invention claimed is:

1. A correction device of a light reception power monitor of an optical module, the correction device comprising:
a storage unit storing a correction table that is referred to when correcting a measured value of light reception power of signal light and stores a plurality of correction values in advance on the basis of a correlation between a plurality of reference values and a plurality of actual values; and
a signal processing unit reading, when an input value indicating the measured value of the light reception power of the signal light matches a reference value in the correction table, a correction value correlated with the reference value from the correction table, and calculating, when the input value does not match any reference values in the correction table, a correction value in accordance with a predetermined calculation formula on the basis of the input value,
wherein the plurality of correction values are stored in the correction table in such a manner that an interval between the plurality of reference values is smaller for a segment in which a change in the actual values is small relative to a change in the reference values than for a segment in which the change in the actual values is large relative to the change in the reference values.

2. The correction device according to claim 1, wherein a number of the plurality of reference values stored in the correction table is reduced as compared to a number of digital input values indicating the light reception power of the signal light, each of the digital input values being represented by a number of bits.

3. The correction device according to claim 1, wherein
the storage unit comprises a calculation information table that stores a nonlinear calculation formula set for each range from a first reference value equal to or less than the input value indicating the measured value of the light reception power of the signal light to less than a second reference value more than the first reference value; and when the input value matches a reference value in the correction table, the signal processing unit reads a correction value corresponding to the reference value from the correction table, and when the input value does not match any reference values in the correction table, the signal processing unit calculates a correction value in accordance with the nonlinear calculation formula set in the range from the first reference value to less than the second reference value in which the input value is included.

4. The correction device according to claim 3, wherein the nonlinear calculation formula is represented as follows:

correction value=A×(input value)$^4$+B×(input value)$^3$+C×(input value)$^2$+D×(input value)+E (with the proviso that A, B, C, D, and E represent predetermined coefficients).

5. The correction device according to claim 3, wherein the nonlinear calculation formula is represented using a reference value uniquely determined on the basis of the input value as follows:

correction value=A×(input value−reference value)$^4$+B×(input value−reference value)$^3$+C×(input value−reference value)$^2$+D×(input value−reference value)+E (with the proviso that A, B, C, D, and E represent predetermined coefficients).

6. The correction device according to claim 3, wherein the nonlinear calculation formula is represented using a maximum reference value $M_k$ (with the proviso that k represents an integer) of reference values smaller than the input value as follows:

correction value=A×(input value−reference value)$^4$+B×(input value−reference value)$^3$+C×(input value−reference value)$^2$+D×(input value−reference value)+E (with the proviso that A, B, C, D, and E represent predetermined coefficients).

7. A correction method for a light reception monitor of an optical module, the correction method comprising:
storing, in a correction table that is referred to when correcting a measured value of light reception power of signal light and stores a plurality of correction values in advance on the basis of a correlation between a plurality of reference values and a plurality of actual values, the plurality of correction values in such a manner that an interval between the plurality of reference values is smaller for a segment in which a change in the actual values is small relative to a change in the reference values than for a segment in which the change in the actual values is large relative to the change in the reference values; and
when the input value indicating the measured value of the light reception power of the signal light matches a reference value in the correction table, reading a correction value correlated with the reference value from the correction table, and when the input value does not match any reference values in the correction table, calculating a correction value in accordance with a predetermined calculation formula on the basis of the input value.

8. A non-transitory computer readable medium storing a program for causing a computer to perform a correction method for a light reception power monitor of an optical module, the method comprising:
referring to a correction table that is referred to when correcting a measured value of light reception power of signal light and stores a plurality of correction values in advance on the basis of a correlation between a plurality of reference values and a plurality of actual values, wherein the plurality of correction values are stored in the correction table in such a manner that an interval between the plurality of reference values is smaller for a segment in which a change in the actual values is small relative to a change in the reference values than for a segment in which the change in the actual values is large relative to the change in the reference values; and
reading, when an input value indicating the measured value of the light reception power of the signal light matches a reference value in the correction table, a correction value corresponding to the reference value from the correction table, and calculating when the input value does not match any reference values in the correction table, a correction value in accordance with a predetermined calculation formula on the basis of the input value.

* * * * *